United States Patent
Kushida et al.

(10) Patent No.: US 9,653,621 B2
(45) Date of Patent: May 16, 2017

(54) SEMICONDUCTOR APPARATUS

(71) Applicants: Tomoyoshi Kushida, Nisshin (JP); Hiroyuki Sakaki, Nagoya (JP); Masato Ohmori, Nagoya (JP)

(72) Inventors: Tomoyoshi Kushida, Nisshin (JP); Hiroyuki Sakaki, Nagoya (JP); Masato Ohmori, Nagoya (JP)

(73) Assignees: TOYOTA JIDOSHA KABUSHIKI KAISHA, Toyota-Shi (JP); TOYOTA SCHOOL FOUNDATION, Nagoya-Shi (JP)

( * ) Notice: Subject to any disclaimer, the term of this patent is extended or adjusted under 35 U.S.C. 154(b) by 0 days.

(21) Appl. No.: 14/383,606

(22) PCT Filed: Mar. 14, 2013

(86) PCT No.: PCT/IB2013/000380
§ 371 (c)(1),
(2) Date: Sep. 8, 2014

(87) PCT Pub. No.: WO2013/140220
PCT Pub. Date: Sep. 26, 2013

(65) Prior Publication Data
US 2015/0108609 A1  Apr. 23, 2015

(30) Foreign Application Priority Data
Mar. 19, 2012 (JP) .................................. 2012-061876

(51) Int. Cl.
*H01L 29/92* (2006.01)
*B82Y 10/00* (2011.01)
(Continued)

(52) U.S. Cl.
CPC .............. *H01L 29/92* (2013.01); *B82Y 10/00* (2013.01); *H01L 29/155* (2013.01); *H01L 29/20* (2013.01); *H01L 29/2003* (2013.01)

(58) Field of Classification Search
USPC ........................................................ 257/615
(Continued)

(56) References Cited

U.S. PATENT DOCUMENTS

| 5,159,421 | A | 10/1992 | Wolff |
| 5,367,183 | A | 11/1994 | Perer et al. |
| 6,275,137 | B1 | 8/2001 | Doppalapudi et al. |

FOREIGN PATENT DOCUMENTS

| JP | 2005-019598 A | 1/2005 |
| JP | 2007-184382 A | 7/2007 |

(Continued)

*Primary Examiner* — Hrayr A Sayadian
(74) *Attorney, Agent, or Firm* — Andrews Kurth Kenyon LLP (57) ABSTRACT

A semiconductor apparatus (10) includes: a layered structure (100) that includes double junction structures that have a first junction (151, 153) where a wide-bandgap layer (102, 104) and a narrow-bandgap layer (101, 103, 105) are layered on each other and a second junction (152, 154) where a narrow-bandgap layer (101, 103, 105) and a wide-bandgap layer (102, 104) are layered on each other, and electrode semiconductor layers (110, 120) are joined to each layer of the layered structure. Each double junction structure includes a pair of a first region (131, 133) that has negative fixed charge and a second region (132, 134) that has positive fixed charge. The first region is closer to the first junction than to a center of the wide-bandgap layer. The second region is closer to the second junction than to the center of the wide-bandgap layer. A 2DEG or a 2DHG is formed at each junction. The semiconductor apparatus functions as an electric energy storage device such as a capacitor.

21 Claims, 7 Drawing Sheets

(51) Int. Cl.
*H01L 29/15* (2006.01)
*H01L 29/20* (2006.01)

(58) Field of Classification Search
IPC ............... B82Y 10/00; H01L 29/92,29/20,
29/2003, 29/155
See application file for complete search history.

(56) References Cited

FOREIGN PATENT DOCUMENTS

| | | |
|---|---|---|
| JP | 2007-208178 A | 8/2007 |
| JP | 2011-077293 A | 4/2011 |

SEMICONDUCTOR APPARATUS

CROSS-REFERENCE TO RELATED APPLICATIONS

This is a national phase application based on the PCT International Patent Application No. PCT/IB2013/000380 filed Mar. 14, 2013, claiming priority to Japanese patent application No. 2012-061876 filed Mar. 19, 2012, the entire contents of both of which are incorporated herein by reference.

BACKGROUND OF THE INVENTION

1. Field of the Invention

The invention relates to a semiconductor apparatus. In particular, the invention relates to a semiconductor apparatus, such as a capacitor or the like, that is formed in a semiconductor substrate.

2. Description of Related Art

Japanese Patent Application Publication No. 2005-19598 (JP 2005-19598 A) describes a capacitor that accumulates charge in a semiconductor layer that is separated by a capacitance insulating film. In order to increase the capacitance of the capacitor without increasing the area that the capacitor takes up in the plane area of a semiconductor substrate, JP 2005-19598 A provides a portion that accumulates charge in the depth direction of the semiconductor substrate.

In a capacitor that accumulates charge in a semiconductor layer separated by a capacitance insulating film as in JP 2005-19598 A, the constructions of the capacitance insulating film, the semiconductor film, etc., need to be made into thin-film constructions in order to further reduce the size of the capacitor and increase the capacity thereof. However, if the construction becomes thin, defects in the insulating film and/or the semiconductor layer becomes more likely to occur. Thus, it is not easy to obtain a small-size and high-capacity capacitor.

SUMMARY OF THE INVENTION

A semiconductor apparatus in accordance with a first aspect of the invention includes: a layered structure in which at least one narrow-bandgap layer formed from a material that has a narrower bandgap than the material of a layer adjacent to the narrow-bandgap layer in a first direction or a direction opposite to the first direction and at least one wide-bandgap layer formed from a material that has a wider bandgap than the material of a layer adjacent to the wide-bandgap layer in the first direction or the direction opposite to the first direction are alternately layered, the layered structure including at least one double junction structure that has a first junction at which the wide-bandgap layer and the narrow-bandgap layer are layered and joined to each other in that order in the first direction and a second junction at which the narrow-bandgap layer and the wide-bandgap layer are layered and joined to each other in that order in the first direction, and each of the at least one double junction structure contains at least one pair of a first region that has negative fixed charge and a second region that has positive fixed charge; a first electrode semiconductor layer of a first electroconductive type which extends in a second direction that intersects with the first direction and which is joined to each narrow-bandgap layer of the layered structure and each wide-bandgap layer of the layered structure; and a second electrode semiconductor layer of a second electroconductive type which extends in a third direction that intersects with the first direction and which is joined to each narrow-bandgap layer of the layered structure and each wide-bandgap layer of the layered structure, wherein the first region is closer to the first junction than to a center position of the wide-bandgap layer in the first direction, and the second region is closer to the second junction than to the center position of the wide-bandgap layer in the first direction.

A semiconductor apparatus in accordance with a second aspect of the invention includes: a layered structure in which at least one narrow-bandgap layer formed from a material that has a narrower bandgap than the material of a layer adjacent to the narrow-bandgap layer in a first direction or a direction opposite to the first direction and at least one wide-bandgap layer formed from a material that has a wider bandgap than the material of a layer adjacent to the wide-bandgap layer in the first direction or the direction opposite to the first direction are alternately layered, the layered structure including at least one double junction structure that has a first junction at which the wide-bandgap layer and the narrow-bandgap layer are layered and joined to each other in that order in the first direction and a second junction at which the narrow-bandgap layer and the wide-bandgap layer are layered and joined to each other in that order in the first direction, and at least one pair of a first region that has negative fixed charge and a second region that has positive fixed charge are contained; a Schottky electrode layer which extends in a second direction that intersects with the first direction and which is Schottky-joined to each narrow-bandgap layer of the layered structure and each wide-bandgap layer of the layered structure; and an electrode semiconductor layer which extends in a third direction that intersects with the first direction and which is joined to each narrow-bandgap layer of the layered structure and each wide-bandgap layer of the layered structure, wherein the first region is closer to the first junction than to a center position of the wide-bandgap layer in the first direction, and the second region is closer to the second junction than to the center position of the wide-bandgap layer in the first direction.

In the foregoing aspect of the invention, difference between concentration of hole induced by the negative fixed charge and concentration of electron induced by the positive fixed charge may be such a concentration difference that the hole alone or the electron alone becomes absent when voltage is applied between the first electrode semiconductor layer and the second electrode semiconductor layer.

In the foregoing aspect, the semiconductor apparatus may be an electric energy storage semiconductor apparatus.

In the foregoing aspect, the first region may be formed by doping the negative fixed charge into the wide-bandgap layer joined at the first junction, and the second region may be formed by doping the positive fixed charge into the wide-bandgap layer joined at the second junction.

In the foregoing aspect, the negative fixed charge of the first region and the positive fixed charge of the second region may include polarization charge that is produced by at least one of spontaneous polarization and piezopolarization.

In the foregoing aspect, the negative fixed charge of the first region and the positive fixed charge of the second region may include both fixed charge that is doped and polarization charge produced by at least one of spontaneous polarization and piezopolarization.

In the foregoing aspect, the semiconductor apparatus may further include a third region provided between the first region and the second region that are provided in one of the at least one double junction structure or between the first region provided in one of two mutually adjacent double junction structures of the at least one double junction structure and the second region provided in another one of the two mutually adjacent double junction structures of the at least one double junction structure, the third region having a lower concentration of the positive fixed charge or the negative fixed charge than the first region and the second region.

In the foregoing aspect, the third region may have a region that has negative fixed charge and a region that has positive fixed charge, and the region that has negative fixed charge may be closer to the second region than to the region that has positive fixed charge.

In the foregoing aspect, the third region may be provided in a layer that has the lowest withstanding voltage of the layers provided in one of the at least one double junction structure.

In the foregoing aspect, the first electrode semiconductor layer may be formed by doping a first electroconductive type impurity into each layer of the layered structure.

In the foregoing aspect, the second electrode semiconductor layer may be formed by doping a second electroconductive type impurity into each layer of the layered structure.

In the foregoing aspect, the first electrode semiconductor layer or the second electrode semiconductor layer may be formed from the same material as a layer that has the narrowest bandgap of the layers that are included in the layered structure, and may be formed as a single semiconductor layer.

According to the foregoing aspects of the invention, a small-size semiconductor apparatus can be realized.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

The semiconductor apparatus of the invention can be suitably used as an electric energy storage semiconductor apparatus such as a capacitor or the like. A first semiconductor apparatus in accordance with the invention includes: a layered structure in which at least three semiconductor layers are layered; a first electroconductive type electrode semiconductor layer extending in a second direction that intersects with a first direction and joined to each layer of the layered structure; and a second electroconductive type electrode semiconductor layer extending in a third direction that intersects with the first direction and joined to each layer of the layered structure. A second semiconductor apparatus in accordance with the invention includes: a layered structure in which at least three semiconductor layers are layered; a Schottky electrode layer extending in a second direction that intersects with a first direction and Schottky-joined to each layer of the layered structure; and an electrode semiconductor layer extending in a third direction that intersects with the first direction and joined to each layer of the layered structure.

In the semiconductor apparatus of the invention, the layered structure is formed by layering the semiconductor layers that differ in bandgap. Examples of the combinations of the semiconductor layers that differ in bandgap include layer combinations of two or more kinds of crystal materials, isotopic materials and crystal structure materials. More concretely, the possible combinations of crystal materials are combinations of diverse elements, for example: combinations of group III-V semiconductor compounds containing one or more species of the group III atoms and one or more species of the group V atoms, such as a combination of AlGaN and GaN, a combination of AlGaAs and GaAs, a combination of InAlGaAsP and InGaP, etc.; combinations of group II-VI semiconductor compounds containing one or more species of the group II atoms and one or more species of the group VI atoms, such as a combination of ZnMgO and ZnO, etc.; combinations of group IV semiconductor compounds that contain one or more species of the group IV atoms and that differ from each other in compositional ratio, such as a combination of SiGeC, SiGeSi and Ge, etc.; combinations of group II-IV-VI semiconductor compounds, such as a combination of CdS and CZTS, etc.; etc. It is to be noted that with regard to the above-listed compounds, the suffixes that indicate the compositional ratios are omitted, and in applications, such compounds with appropriate compositional ratios can be used. Examples of the combinations of isotopic materials include a combination of $^{13}$C and $^{12}$C and a combination of $^{28}$Si, $^{29}$Si and $^{30}$Si. Examples of the combinations of crystal structure materials include a combination of wurtzite structure GaN and zinc blende structure GaN and a combination of single-crystal GaN and polycrystal GaN. As for the combinations of semiconductor layers that differ in bandgap, combinations may be combinations with large difference in bandgap and small difference in lattice constant and combinations with large difference in bandgap and a large spontaneous polarization coefficient and a large piezopolarization coefficient. Each semiconductor layer may have a characteristic of high heat conductivity, high mobility, high saturation velocity and low defect density. Furthermore, combinations may be combinations with large difference in bandgap, small difference in lattice constant and large coefficients of spontaneous polarization and piezopolarization, such as a combination of AlGaN and GaN, etc.

The semiconductor layers that form the layered structure are layered so that narrow-bandgap layers and wide-bandgap layers alternate with each other in the first direction (e.g., a direction from the reverse surface side to the obverse surface side of the semiconductor apparatus). Each narrow-bandgap layer is formed from a material that has a narrower bandgap than the material of the layer adjacent to the narrow-bandgap layer in the first direction or the opposite direction. Each wide-bandgap layer is formed from a material that has a wider bandgap than the material of the layer adjacent to the wide-bandgap layer in the first direction or the opposite direction. Incidentally, each of the narrow-bandgap and wide-bandgap layers may be an intrinsic semiconductor layer.

Since the layered structure has at least three semiconductor layers, the layered structure includes at least one first junction portion where a wide-bandgap layer and a narrow-bandgap layer are layered and joined to each other in that order in the first direction and at least one second junction portion where a narrow-bandgap layer and a wide-bandgap layer are layered and joined to each other in that order in the first direction (hereinafter, a connecting structure that includes a pair of a first junction portion and a second junction portion will be referred to as "double junction structure"). In each double junction structure, the first junction portion and the second junction portion may be disposed in that order in the first direction or, conversely, the second junction portion and the first junction portion may be disposed in that order in the first direction. Examples of layered structures that have three layers will be shown and concretely described. In a layered structure in which a narrow-bandgap layer, a wide-bandgap layer and a narrow-bandgap layer are disposed in that order in the first direction, the second junction portion and the first junction portion are disposed in that order in the first direction. Conversely, in a layered structure in which a wide-bandgap layer, a narrow-bandgap layer and a wide-bandgap layer are disposed in that order in the first direction, the first junction portion and the second junction portion are disposed in that order in the first direction.

The layered structure includes one double junction structure or a plurality of double junction structures that are layered in the first direction. If one narrow-bandgap layer and one wide-bandgap layer are added to a layered structure, the number of double junction structures in the layered structure increases by one. For example, in a layered structure that has five layers in total as a result of the alternate layering of narrow-bandgap layers and wide-bandgap layers, the number of double junction structures in the layered structure is two.

In a layered structure in which three or more kinds of semiconductor layers that differ in bandgap from each other are layered, the combinations of the narrow-bandgap layer and the wide-bandgap layer of the junction portions may be different for each junction portion. Concretely, for example, layers of $Al_{1-x}Ga_xAs/GaAs/Al_{1-y}Ga_yAs$ (where $x \neq y$) may be layered in that order, or layers of $^{29}Si/^{28}Si/^{30}Si$ may be layered in that order. Furthermore, the combinations of the narrow-bandgap layer and the wide-bandgap layer of the first junction portion and the narrow-bandgap layer and the wide-bandgap layer of the second junction portion in the double junction structures may be different for each double junction structure. For example, layers of $Al_{1-x}Ga_xAs/GaAs/Al_{1-y}Ga_yAs/GaAs/Al_{1-x}Ga_xAs$ may be layered in that order, or layers of $Al_{1-x}Ga_xAs/GaAs/Al_{1-x}Ga_xAs/GaAs/Al_{1-y}Ga_yAs GaAs/Al_{1-y}Ga_yAs$ may also be layered in that order. In the foregoing composition formulas, $0<x<1$, $0<y<1$ and $x \neq y$.

Each double junction structure of the layered structure includes at least one pair of a first region that has negative fixed charge and a second region that has positive fixed charge. The first region is contained in the wide-bandgap layer joined at the first junction portion and is located in a side of the layer which is closer to the first junction portion than to a center position of the wide-bandgap layer in the first direction. The second region is contained in the wide-bandgap layer joined at the second junction portion and is located in a side of the layer which is closer to the second junction portion than to the center position of the wide-bandgap layer in the first direction.

In the semiconductor apparatus of the invention, since at the first junction portion, the wide-bandgap layer portion contains the first region that has negative fixed charge, a 2DHG region is formed in the narrow-bandgap layer joined at the first junction portion to the wide-band gap layer. Furthermore, since at the second junction portion, the wide-bandgap layer contains the second region that has positive fixed charge, a 2DEG region is formed in the narrow-bandgap layer joined at the second junction portion to the wide-bandgap layer. Because the 2DHG region and the 2DEG region accumulate charge, the semiconductor apparatus of the invention can be utilized as an electric energy storage semiconductor apparatus such as a capacitor or the like.

A first semiconductor apparatus in which the electrode semiconductor layer of the first electroconductive type is a p layer and the electrode semiconductor layer of the second electroconductive type is an n layer will be shown as an example and described below. During a non-bias time during which no potential difference is given to the semiconductor apparatus, the 2DHG region is electrically connected to the p layer, but is not electrically connected to the n layer. The 2DEG region is electrically connected to the n layer, but is not electrically connected to the p layer. As a result, the 2DHG region and the 2DEG region accumulate electric charge. When reverse bias voltage is applied to the semiconductor apparatus (during a time of reverse bias), depletion layers extend between the p layer and the 2DHG region and between the n layer and the 2DEG region, so that a withstanding voltage is maintained. A desired withstanding voltage can be kept by adjusting the bandgap and the thickness of each of the layers that constitute the layered structure. A construction in which the material of each wide-bandgap layer is AlGaN and the material of each narrow-bandgap layer is GaN will be shown as example and described more concretely below. When the charge concentration at the interface between a wide-bandgap layer and a narrow-bandgap layer (a total of polarization charge and doped charge) is $1.0 \times 10^{13}$ cm$^{-2}$, a withstanding voltage of about 1 V can be obtained if the thickness D of the wide-bandgap layer and the thickness d of the narrow bandgap layer are both greater than or equal to 100 nm. Charge whose concentration is about the same as the aforementioned charge concentration at the interface can be accumulated in the semiconductor apparatus. According to the semiconductor apparatus of the invention, charge accumulated in the 2DHG region and the 2DEG region, so that a small-size semiconductor apparatus can be realized.

In the first semiconductor apparatus of the invention, the difference between the concentration of the carrier (hole) induced in the first junction portion or the second junction portion by negative fixed charge (the carrier concentration in the 2DHG region) and the concentration of the carrier (electron) induced in the first junction portion or the second junction portion by positive fixed charge (the carrier concentration in the 2DEG region) may be such a concentration difference that hole alone or electron alone becomes absent when voltage is applied between the electrode semiconductor layer of the first electroconductive type (the first electrode semiconductor layer) and the electrode semiconductor layer of the second electroconductive type (the second electrode semiconductor layer). In the second semiconductor apparatus of the invention, the difference between the concentration of the hole induced in the first junction portion or the second junction portion by negative fixed charge and the concentration of the electron induced in the first junction portion or the second junction portion by positive fixed charge may be such a concentration difference that hole alone or electron alone becomes absent when voltage is applied between the Schottky electrode layer and the electrode semiconductor layer.

If the carrier concentration difference between the 2DHG region and the 2DEG region exceeds a predetermined concentration difference (e.g., 20%), the 2DHG or 2DEG region that has the lower carrier concentration of the two regions disappears first and the other one of the 2DHG and 2DEG regions survives when the carrier concentration in the 2DHG region and the carrier concentration in the 2DEG region is reduced by applying a reverse bias voltage to the electrode semiconductor layer of the first electroconductive type and to the electrode semiconductor layer of the second electroconductive type (applying thereto a voltage having such a polarity that the carrier concentration in the 2DHG region and the carrier concentration in the 2DEG region decrease). In this case, electric field concentrates in an end portion of the carrier layer that has survived, the withstanding voltage decreases. Therefore, the carrier concentration difference between the carrier layer induced by negative fixed charge (2DHG region) and the carrier layer induced by positive fixed charge (2DEG region) may be a concentration difference that is equal to or less than 20%, which is "such a concentration difference that hole alone or electron alone becomes absent when voltage is applied between the first electrode semiconductor layer and the second electrode semiconductor layer". Incidentally, a concrete range in numerical value of "such a concentration difference that hole alone or electron alone disappears when voltage is applied to the electrode semiconductor layer of the first electroconductive type and the electrode semiconductor layer of the second electroconductive type is not limited to the aforementioned concentration equal to or less than 20%. The upper limit value of this range in numerical value changes depending on characteristics of the semiconductor materials used in the semiconductor apparatus (electric permittivity or the like), the structure of the semiconductor apparatus (the distance between the first electroconductive type electrode semiconductor layer and the second electroconductive type electrode semiconductor layer, or the like), etc., and sometimes becomes 5% or less, or 50% or less.

The cases where only one of the 2DHG region and the 2DEG region becomes absent include the following two cases. One is the case where the 2DHG region and the 2DEG region coexist. In this case, the electrode area is large. Therefore, this case is effective for size reduction of a semiconductor apparatus as a capacitor. The second case is the case where the 2DHG region and the 2DEG region disappear together. In this case, only fixed charge survives, and part of the voltage is retained by electric field between the fixed charges. Therefore, this case is effective for size reduction of a semiconductor apparatus as a high-withstanding voltage semiconductor apparatus.

In the semiconductor apparatus of the invention, the positive or negative fixed charge may be polarization charge or doped charge. It suffices that the semiconductor apparatus contains at least one of polarization charge and doped charge. The semiconductor apparatus may contain both polarization charge and doped charge. If both polarization charge and doped charge are contained, the positive or negative fixed charge is the sum of the polarization charge and the doped charge. The polarization charge is divided into the polarization charge produced by spontaneous polarization and the polarization charge produced by piezopolarization. For example, if a combination of AlGaN and GaN is used, the polarization charge can be used as positive or negative fixed charge that is described in this specification. Furthermore, for example, if any one of combinations of AlGaAs and GaAs, Si and Ge, $^{13}C$ and $^{12}C$, $^{28}Si$, $^{29}Si$ and Si is used, it is necessary to dope the positive or negative fixed charge that is described in the specification because polarization charge cannot be utilized. Even with a material that allows utilization of polarization charge, charge may be further doped so as to be utilized as positive or negative fixed charge.

In the case where positive or negative fixed charge is doped in a semiconductor layer of the layered structure, the doped charge may be distributed so that charge is present homogeneously in planar directions of the semiconductor layers of the layered structure (the planar directions whose normal vector lies is in the first direction) and is present to a depth equal to a total thickness of several to several tens of atoms (i.e., less than or equal to about 10 nm). Herein, being distributed "homogeneously in planar directions" is not limited to a state in which atoms are distributed uniformly in planar directions (a so-called δ-doped state) but also includes a state in which several atoms form a dot-shaped or line-shaped aggregate and such aggregates of atoms are homogeneously distributed at substantially equal intervals in planar directions.

The layered structure may further include a third region that has a lower fixed charge concentration than the first region and the second region. The third region may be provided between the first region and the second region in a double junction structure. Furthermore, if the layered structure has two or more double junction structures, the third region may be provided between the first region of one of two adjacent double junction structures and the second region of the other one of the two adjacent double junction structures.

The fixed charge of the third region may be only one of negative fixed charge and positive fixed charge, may also be both. In the case where the third region has both negative fixed charge and positive fixed charge, the region in the third region which has negative fixed charge may be closer to the second region than the region in the third region which has positive fixed charge is to the second region. That is, the region that has positive fixed charge may be closer to the first region than the region that has negative fixed charge is to the first region.

The third region may be provided in a narrow-bandgap layer, or may also be provided in a wide-bandgap layer. In order to increase the withstanding voltage of the semiconductor apparatus, the third region may be provided in a layer that has the lowest withstanding voltage (peak inverse voltage) of the layers of a double junction structure.

The first electroconductive type electrode semiconductor layer and the second electroconductive type electrode semiconductor layer in the first semiconductor apparatus of the invention may be of a multilayer structure or a single-layer structure. If both the first electroconductive type electrode semiconductor layer and the second electroconductive type electrode semiconductor layer have a single-layer structure, the electrode semiconductor layers may be formed by using the same material as that of the narrow-bandgap layer that constitutes the layered structure, rather than by using the same material as that of the wide-bandgap layer that constitutes the layered structure. In this case, each of the electrode semiconductor layers may be formed as a single semiconductor layer by using the same material as that of a layer whose bandgap is the narrowest in the layered structure. The first electroconductive type electrode semiconductor layer and the second electroconductive type electrode semiconductor layer may be a semiconductor layer that is other than the semiconductor layers that constitute the layered structure, and may be joined to each other. In the case where each of the first electroconductive type electrode semiconductor layer and the second electroconductive type electrode semiconductor layer is of a multilayer layered structure structure, the first electroconductive type electrode semiconductor layer and the second electroconductive type electrode semiconductor layer may be formed by implanting a first electroconductive type impurity and a second electroconductive type impurity, respectively, into the layered structure.

The first electroconductive type electrode semiconductor layer and the second electroconductive type electrode semiconductor layer of the semiconductor apparatus may be joined, at their surfaces or the like, to metal electrodes or the like so that voltage is applied to the electrode semiconductor layers via the metal electrodes.

In the second semiconductor apparatus of the invention, the electrode semiconductor layer may be a first electroconductive type electrode semiconductor layer or may also be a second electroconductive type electrode semiconductor layer, according to the material of the Schottky electrode layer that makes a pair with the electrode semiconductor layer. The electrode semiconductor layer of the second semiconductor apparatus can be provided with substantially the same configuration as that of the first electroconductive type electrode semiconductor layer of the first semiconductor apparatus or that of the second electroconductive type electrode semiconductor layer of the first semiconductor apparatus.

The Schottky electrode layer may be of a multilayer layered structure structure or of a single-layer structure. In the case where a combination of AlGaN and GaN or a combination of AlGaAs and GaAs is used as materials of the layered structure, a metal layer of Al, Pt, Au, Ni or Pd or a metal layer layered structure formed by laminating layers of any two or more of these metals may be suitably used as the Schottky electrode layer. Since the combination of AlGaN and GaN and the combination of AlGaAs and GaAs have a wide bandgap, these metal materials used with either one of the combinations form a Schottky junction both with respect to hole and with respect to electron.

According to the invention, it is possible to not only advantageously achieve increased withstanding voltage by the positive or negative fixed charge in the layered structure but also achieve reduced loss due to the existence of carrier layers (the 2DHG and 2DEG regions) in intrinsic semiconductor layers that constitute the layered structure. Therefore, it is possible to achieve both increased withstanding voltage and reduced loss in the semiconductor apparatus and reduce the size of the semiconductor apparatus.

First Embodiment

Figure 1:
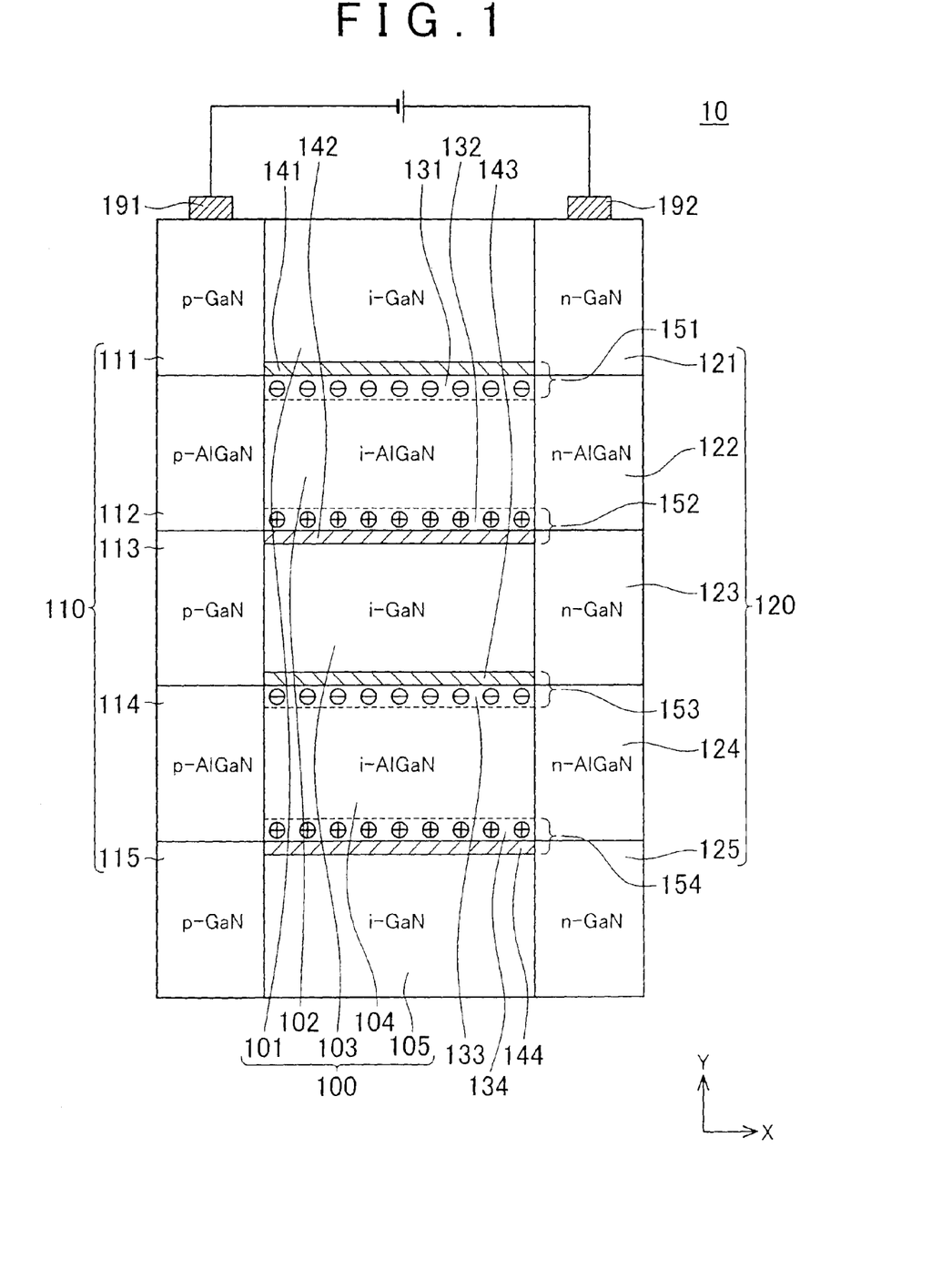
FIG. 1 is a diagram schematically showing a sectional structure of a semiconductor apparatus in accordance with a first embodiment of the invention.

As shown in FIG. 1, a semiconductor apparatus 10 includes a layered structure 100, a p-type electrode semiconductor layer 110, an n-type electrode semiconductor layer 120, a first electrode 191 joined to a surface of the p-type electrode semiconductor layer 110, and a second electrode 192 joined to a surface of the n-type electrode semiconductor layer 120. The layered structure 100 includes narrow-bandgap layers 101, 103 and 105 each of which is an intrinsic semiconductor layer whose material is GaN, and wide-bandgap layers 102 and 104 each of which is an intrinsic semiconductor layer whose material is AlGaN. The narrow-bandgap layers 101, 103 and 105 and the wide-bandgap layers 102 and 104 are layered in the order of the narrow-bandgap layer 105, the wide-bandgap layer 104, the narrow-bandgap layer 103, the wide-bandgap layer 102 and the narrow-bandgap layer 101 in the first direction (a positive direction along an arrow Y in FIG. 1). Each of the wide-bandgap layers 102 and 104 is formed from a material that has a wider bandgap than the material of the narrow-bandgap layer 101 or 103 that is adjacent to the wide-bandgap layer 102 or 104, respectively, in the first direction. Each of the narrow-bandgap layers 103 and 105 is formed from a material that has a narrower bandgap than the material of the wide-bandgap layer 102 or 104 that is adjacent to the narrow-bandgap layer 103 or 105, respectively, in the first direction. The narrow-bandgap layer 101 is formed from the material whose bandgap is narrower than the bandgap of the material of the wide-bandgap layer 102 adjacent to the narrow-bandgap layer 101 in the direction opposite to the first direction.

The narrow-bandgap layer 101 and the wide-bandgap layer 102 are joined to each other at a first junction portion 151. The wide-bandgap layer 102 and the narrow-bandgap layer 103 are joined to each other at a second junction portion 152. The narrow-bandgap layer 103 and the wide-bandgap layer 104 are joined to each other at a first junction portion 153. The wide-bandgap layer 104 and the narrow-bandgap layer 105 are joined to each other at a second junction portion 154. The layered structure 100 has a double junction structure that includes the first junction portion 151 and the second junction portion 152, and a double junction structure that includes the first junction portion 153 and the second junction portion 154. That is, the layered structure 100 has two double junction structures in which a second junction portion and a first junction portion are disposed in that order in the first direction.

The electrode semiconductor layer 110 extends in a second direction (a negative direction along an arrow X shown in FIG. 1) from the layered structure 100. That is, the electrode semiconductor layer 110 is adjacent to the layered structure 100 in the second direction. The electrode semiconductor layer 120 extends in a third direction (the positive direction along the arrow X shown in FIG. 1) from the layered structure 100. That is, the electrode semiconductor layer 120 is adjacent to the layered structure 100 in the third direction. The second direction and the third direction are orthogonal to the first direction. The electrode semiconductor layer 110 and the electrode semiconductor layer 120 are on opposite sides of the layered structure 100, and face each other in the X directions.

The p-type electrode semiconductor layer 110 includes p layers 111, 113 and 115 each of which is a p-type semiconductor layer whose material is GaN, and p layers 112 and 114 each of which is a p-type semiconductor layer whose material is AlGaN. The n-type electrode semiconductor layer 120 includes n layers 121, 123 and 125 each of which is an n-type semiconductor layer whose material is GaN, and n layers 122 and 124 each of which is an n-type semiconductor layer whose material is AlGaN. The p layer 111, the narrow-bandgap layer 101 and the n layer 121 are formed by a series of GaN material layers. The p layer 112, the wide-bandgap layer 102 and the n layer 122 are formed by a series of AlGaN material layers. The p layer 113, the narrow-bandgap layer 103 and the n layer 123 are formed by a series of GaN material layers. The p layer 114, the wide-bandgap layer 104 and the n layer 124 are formed by a series of AlGaN material layers. The p layer 115, the narrow-bandgap layer 105 and the n layer 125 are formed by a series of GaN material layers. The p layers 111 to 115 and the n layers 121 to 125 can be formed by layering the wide-bandgap layers 102 and 104, which are intrinsic semiconductor layers, or the narrow-bandgap layers 101, 103 and 105, which are also intrinsic semiconductor layers, and then implanting each of a p-type impurity and an n-type impurity into a corresponding one of two opposite end portions of the layered layers.

The wide-bandgap layer 102 contains a first region 131 that has negative fixed charge, and a second region 132 that has positive fixed charge. In the case where a GaN material and an AlGaN material are combined, the first region 131 and the second region 132 are formed due to polarization. The first region 131 contained in the wide-bandgap layer 102 is in a side that is closer to the first junction portion 151 than to the central position in the wide-bandgap layer 102 in the first direction. The second region 132 contained in the wide-bandgap layer 102 is in a side that is closer to the second junction portion 152 than to the central position in the wide-bandgap layer 102 in the first direction. More concretely, the first region 131 contained in the wide-bandgap layer 102 is near the first junction portion 151, and the second region 132 contained in the wide-bandgap layer 102 is near the second junction portion 152. Likewise, the wide-bandgap layer 104 contains a first region 133 that has negative fixed charge, and a second region 134 that has positive fixed charge. The first region 133 contained in the wide-bandgap layer 104 is in a side that is closer to the first junction portion 153 than to a central position in the wide-bandgap layer 104 in the first direction. The second region 134 contained in the wide-bandgap layer 104 is in a side that is closer to the second junction portion 154 than to the central position in the wide-bandgap layer 104 in the first direction. More concretely, the first region 133 contained in the wide-bandgap layer 104 is near the first junction portion 153, and the second region 134 in the wide-bandgap layer 104 is near the second junction portion 154.

When voltage is not applied between the electrode semiconductor layer 110 and the electrode semiconductor layer 120 of the semiconductor apparatus 10 (at the time of no bias), 2DHG regions 141 and 143 are formed in the narrow-bandgap layers 101 and 103 which are joined at the first junction portions 151 and 153, respectively. Furthermore, 2DEG regions 142 and 144 are formed in the narrow-bandgap layers 103 and 105 which are joined at the second junction portions 152 and 154, respectively. The 2DHG regions 141 and 143 are electrically connected to the p layers 111 and 113, but not electrically connected to the n layers 121 and 123. The 2DEG regions 142 and 144 are electrically connected to the n layers 123 and 125, but not electrically connected to the p layers 113 and 115. As a result, the 2DHG regions 141 and 143 and the 2DEG regions 142 and 144 accumulate charge. When a potential difference is given between the electrode semiconductor layer 110 and the electrode semiconductor layer 120, with the first electrode 191 being the lower potential side and the second electrode 192 being the higher potential side (at the time of reverse bias) as shown in FIG. 1, depletion layers extend between the electrode semiconductor layer 110 and the 2DHG regions 141 and 143 and between the electrode semiconductor layer 120 and the 2DEG regions 142 and 144, so that a withstanding voltage is maintained. Incidentally, the carrier concentration difference between the 2DHG regions 141 and 143 and the 2DEG regions 142 and 144 is such a concentration difference that positive holes alone or electrons alone become absent when voltage is applied between the electrode semiconductor layer 110 and the electrode semiconductor layer 120. A desired withstanding voltage can be maintained by adjusting the thickness or the bandgap of each of the layers that constitute the layered structure 100. According to the semiconductor apparatus 10, since charge is accumulated by the 2DHG regions 141 and 143 and the 2DEG regions 142 and 144, a small-size semiconductor apparatus can be realized.

Second Embodiment

Figure 2:
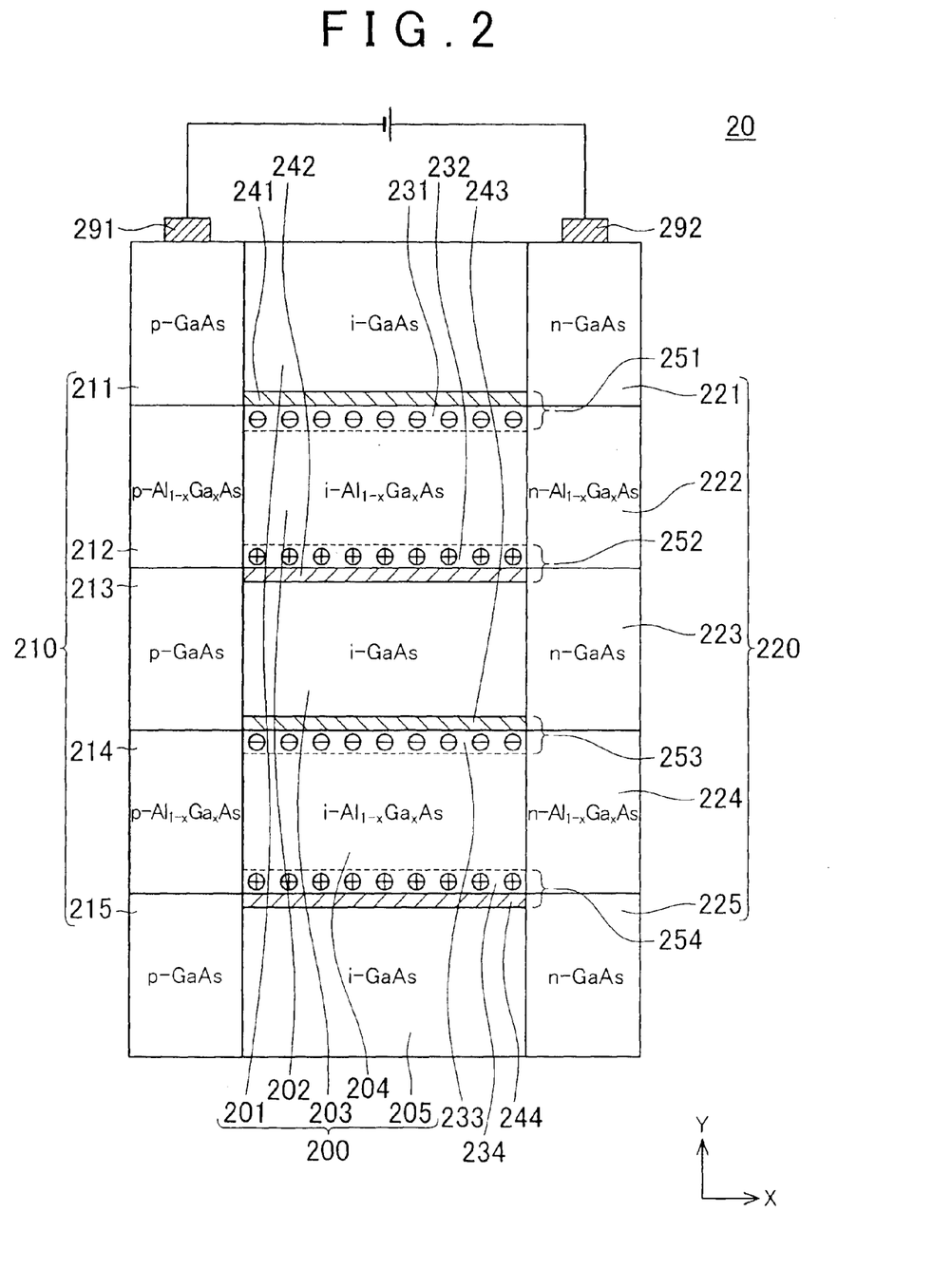
FIG. 2 is a diagram schematically showing a sectional structure of a semiconductor apparatus in accordance with a second embodiment of the invention.

In a semiconductor apparatus according to a second embodiment of the invention, the positive or negative fixed charge is doped charge. As shown in FIG. 2, when a combination of $Al_{1-x}Ga_xAs$ (0<x<1) and GaAs is used, polarization charge cannot be utilized and therefore positive or negative fixed charge is doped so as to form a first region and a second region in each wide-bandgap layer.

In a semiconductor apparatus 20 shown in FIG. 2, layers of GaAs are provided in place of the layers formed by using the GaN material in the semiconductor apparatus 10, and layers of $Al_{1-x}Ga_xAs$ are provided in place of the layers formed by using AlGaN in the semiconductor apparatus 10. The layered structure 200 includes narrow-bandgap layers 201, 203 and 205 and wide-bandgap layers 202 and 204. A p-type electrode semiconductor layer 210 includes p layers 211 to 215. An n-type electrode 220 includes n layers 221 to 225.

The wide-bandgap layer 202 has a first region 231 that has negative fixed charge, and a second region 232 that has positive fixed charge. The first region 231 and the second region 232 are formed by δ-doping negative fixed charge and positive fixed charge, respectively, into the wide-bandgap layer 202. The wide-bandgap layer 204 has a first region 233 that has negative fixed charge, and a second region 234 that has positive fixed charge. The first region 233 and the second region 234 are formed by δ-doping negative fixed charge and positive fixed charge, respectively, into the wide-bandgap layer 204. Other concrete configurations of the semiconductor apparatus 20 are substantially the same as those of the semiconductor apparatus 10 of the first embodiment. The other concrete configurations of the semiconductor apparatus 20 can be understood merely by reading the description of the semiconductor apparatus 10 while assuming that the 1 in the hundred's place of each reference numeral has been replaced by 2.

As shown with the second embodiment, even in a layered structure that has only one or more double junction structures each of which has a combination of a wide-bandgap layer (202, 204) and narrow-bandgap layers (201, 203, 205) in which polarization charge cannot be utilized, the first region (231, 233) and the second region (232, 234) can be formed in each wide-bandgap layer (202, 204) by doping fixed charge. Therefore, in the semiconductor apparatus 20, 2DHG regions 241 and 243 and 2DEG regions 242 and 244 are formed, so that charge can be accumulated therein. Operation and effects achieved at the non-bias time and at the reverse-bias time are substantially the same as those achieved in the semiconductor apparatus 10.

Third Embodiment

Figure 3:
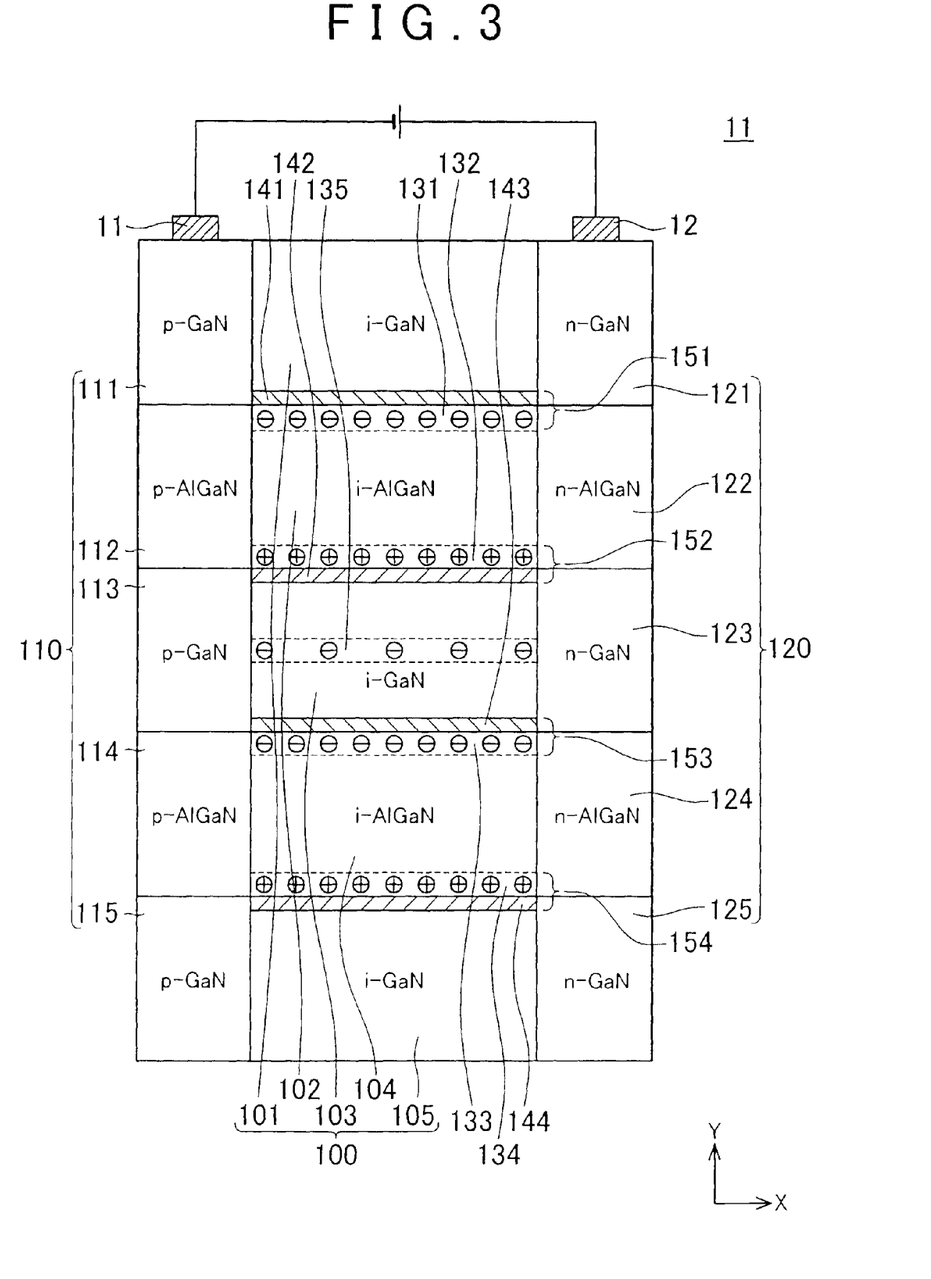
FIG. 3 is a diagram schematically showing a sectional structure of a semiconductor apparatus in accordance with a third embodiment of the invention.

In a semiconductor apparatus 11 shown in FIG. 3, the narrow-bandgap layer 103 has a third region 135 that has negative fixed charge. The third region 135 is formed by doping negative fixed charge into the narrow-bandgap layer 103. The concentration of the negative fixed charge in the third region 135 is lower than the concentration of the negative fixed charge in the first regions 131 and 133 and the concentration of the positive fixed charge in the second regions 132 and 134. The third region 135 is provided between the second region 132 of the double junction structure that has the first junction portion 151 and the second junction portion 152, and the first region 133 of the double junction structure that has the first junction portion 153 and the second junction portion 154. Other concrete configurations of the semiconductor apparatus 11 are substantially the same as those of the semiconductor apparatus 10.

Incidentally, in the case where fixed charge is formed by doping, the degree of freedom in the position to form the fixed charge is high, so that a first region and a second region can be formed not only in the vicinity of the wide-bandgap layer side of the first junction portion or the second junction portion but also in the vicinity of the narrow-bandgap layer side of the first junction portion or the second junction portion. It is also possible to form a 2DHG region and a 2DEG region by fixed charge in the vicinity of the heterojunction formed at the narrow-bandgap layer side.

Since the semiconductor apparatus 11 is provided with the third region 135 that has negative fixed charge, the band of the narrow-bandgap layer 103 is raised at the time of reverse bias. As a result, the tunnel current of electrons between the 2DHG region 143 and the 2DEG region 142 decreases, and the withstanding voltage between the 2DHG region 143 and the 2DEG region 142 improves. Other operation and effects achieved at the time of non-bias and the time of reverse bias are substantially the same as in the semiconductor apparatus 10.

Fourth Embodiment

Both a third region that has negative fixed charge and a third region that has positive fixed charge may be formed in a layered structure. In a semiconductor apparatus 12 shown in FIG. 4, the narrow-bandgap layer 103 has a third region 137 that has negative fixed charge and a third region 138 that has positive fixed charge. The third regions 137 and 138 are formed by doping negative fixed charge and positive fixed charge, respectively, into the narrow-bandgap layer 103. The concentration of the negative fixed charge in the third region 137 and the concentration of the positive fixed charge in the third region 138 are lower than the concentration of the negative fixed charge in the first regions 131 and 133 and the concentration of the positive fixed charge in the second regions 132 and 134. The third regions 137 and 138 are provided between the second region 132 of the double junction structure that has the first junction portion 151 and the second junction portion 152 and the first region 133 of the double junction structure that has the first junction portion 153 and the second junction portion 154. Other concrete configurations of the semiconductor apparatus 12 are substantially the same as those of the semiconductor apparatus 10.

Figure 4:
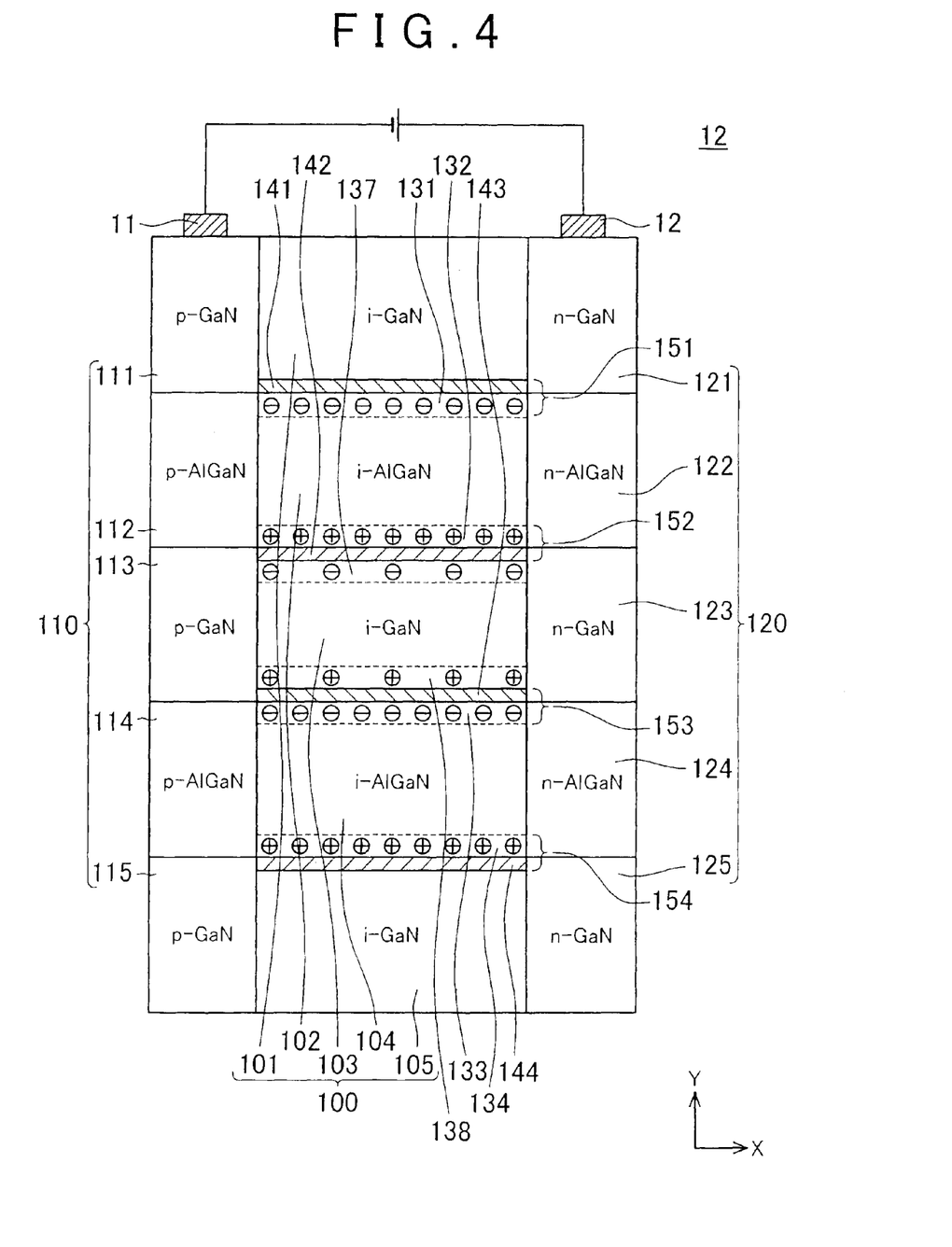
FIG. 4 is a diagram schematically showing a sectional structure of a semiconductor apparatus in accordance with a fourth embodiment of the invention.

Since the semiconductor apparatus 12 is provided with the third regions 137 and 138, the band of the narrow-bandgap layer 103 is raised at the time of reverse bias, as is the case with the semiconductor apparatus 11. As a result, between the 2DHG region 143 and the 2DEG region 142, the tunnel current of electrons and the tunnel current of positive holes decrease. As a result, the withstanding voltage between the 2DHG region 143 and the 2DEG region 142 further improves over the third embodiment. Other operation and effects at the time of non-bias and at the time of reverse bias are substantially the same as those of the semiconductor apparatus 10.

Fifth Embodiment

Figure 5:
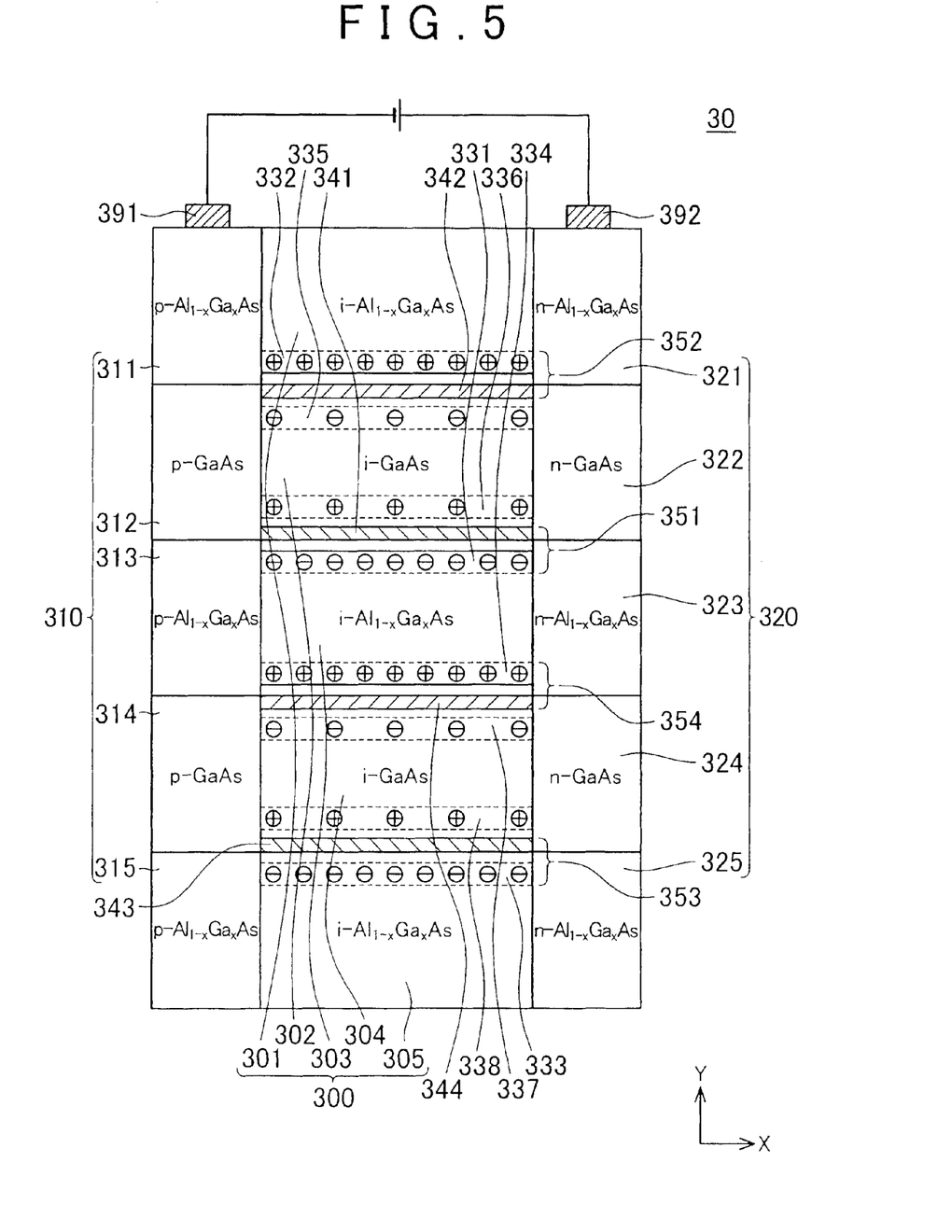
FIG. 5 is a diagram schematically showing a sectional structure of a semiconductor apparatus in accordance with a fifth embodiment of the invention.

As shown in FIG. 5, a semiconductor apparatus 30 includes a layered structure 300, a p-type electrode semiconductor layer 310, an n-type electrode semiconductor layer 320, a first electrode 391 joined to a surface of the p-type electrode semiconductor layer 310, and a second electrode 392 joined to a surface of the n-type electrode semiconductor layer 320. The layered structure 300 includes wide-bandgap layers 301, 303 and 305 each of which is an intrinsic semiconductor layer whose material is $Al_{1-x}Ga_xAs$ ($0<x<1$), and narrow-bandgap layers 302 and 304 each of which is an intrinsic semiconductor layer whose material is GaAs. The wide-bandgap layers 301, 303 and 305 and the narrow-bandgap layers 302 and 304 are layered in the order of the wide-bandgap layer 305, the narrow-bandgap layer 304, the wide-bandgap layer 303, the narrow-bandgap layer 302 and the wide-bandgap layer 301 in the first direction (a positive direction along an arrow Y shown in FIG. 5). The narrow-bandgap layers 302 and 304 are formed from a material that has a narrower bandgap than the material of the wide-bandgap layers 301 and 303 that are adjacent to the narrow-bandgap layers 302 and 304 in the first direction. The wide-bandgap layers 303 and 305 are formed by a material that has a wider bandgap than the material of the narrow-bandgap layers 302 and 304 that are adjacent to the wide-bandgap layers 303 and 305 in the first direction. The wide-bandgap layer 301 is formed from a material that has a wider bandgap than the material of the narrow-bandgap layer 302 adjacent to the wide-bandgap layer 301 in the direction opposite to the first direction.

The wide-bandgap layer 301 and the narrow-bandgap layer 302 are joined at a second junction portion 352. The narrow-bandgap layer 302 and the wide-bandgap layer 303 are joined by a first junction portion 351. The wide-bandgap layer 303 and the narrow-bandgap layer 304 are joined at a second junction portion 354. The narrow-bandgap layer 304 and the wide-bandgap layer 305 are joined at a first junction portion 353. The layered structure 300 has a double junction structure that includes the first junction portion 351 and the second junction portion 352, and a double junction structure that includes the first junction portion 353 and the second junction portion 354. The layered structure 300 has two double junction structures in each of which a first junction portion and a second junction portion are disposed in that order in the first direction.

The electrode semiconductor layer 310 extends in a second direction (a negative direction along an arrow X shown in FIG. 5) from the layered structure 300. The electrode semiconductor layer 320 extends in a third direction (the positive direction along the arrow X shown in FIG. 5) from the layered structure 300. The second direction and the third direction are orthogonal to the first direction. The electrode semiconductor layer 310 and the electrode semiconductor layer 320 are positioned on two opposite ends of the layered structure 300 in the X directions, and face each other.

The p-type electrode semiconductor layer 310 includes p layers 311, 313 and 315 each of which is a p-type semiconductor layer whose material is $Al_{1-x}Ga_xAs$, and p layers 312 and 314 each of which is a p-type semiconductor layer whose material is GaAs. The n-type electrode semiconductor layer 320 includes n layers 321, 323 and 325 each of which is an n-type semiconductor layer whose material is $Al_{1-x}Ga_xAs$, and p layers 322 and 324 each of which is an n-type semiconductor layer whose material is GaAs. The p layer 311, the wide-bandgap layer 301 and the n layer 321 are formed by a series of $Al_{1-x}Ga_xAs$ material layers. The p layer 312, the narrow-bandgap layer 302 and the n layer 322 are formed by a series of GaAs material layers. The p layer 313, the wide-bandgap layer 303 and the n layer 323 are formed by a series of $Al_{1-x}Ga_xAs$ material layers. The p layer 314, the narrow-bandgap layer 304, and the n layer 324 are formed by a series of GaAs material layers. The p layer 315, the wide-bandgap layer 305 and the n layer 325 are formed by a series of $Al_{1-x}Ga_xAs$ material layers. The p layers 311 to 315 and the n layers 321 to 325 can be formed by layering the narrow-bandgap layers 302 and 304, which are intrinsic semiconductor layers, or the wide-bandgap layers 301, 303 and 305, which are also intrinsic semiconductor layers, and then implanting each of a p-type impurity or an n-type impurity into a corresponding one of two opposite end portions of each layered layer.

The wide-bandgap layer 301 contains a second region 332 that has positive fixed charge. The wide-bandgap layer 303 contains a first region 331 that has negative fixed charge and a second region 334 that has positive fixed charge. The wide-bandgap layer 305 contains a first region 333 that has negative fixed charge. The first regions 331 and 333 and the second regions 332 and 334 are formed by δ-doping negative fixed charge or positive fixed charge, as appropriate, into the wide-bandgap layers 301, 303 and 305. The first region 331 contained in the wide-bandgap layer 303 is in a side that is closer to the first junction portion 351 than to a central position in the wide-bandgap layer 303 in the first direction. The second region 332 contained in the wide-bandgap layer 301 is in a side that is closer to the second junction portion 352 than to a central position in the wide-bandgap layer 301 in the first direction. More concretely, the first region 331 in the wide-bandgap layer 303 is contained in a location near the first junction portion 351, and the second region 332 in the wide-bandgap layer 301 is contained in a location near the second junction portion 352. The first region 333 contained in the wide-bandgap layer 305 is in a side that is closer to the first junction portion 353 than to a central position in the wide-bandgap layer 305 in the first direction. The second region 334 contained in the wide-bandgap layer 303 is in a side that is closer to the second junction portion 354 than to a central position in the wide-bandgap layer 303 in the first direction. More concretely, the first region 333 in the wide-bandgap layer 305 is contained in a location near the first junction portion 353, and the second region 334 in the wide-bandgap layer 303 is contained in a location near the second junction portion 354.

The narrow-bandgap layer 302 has a third region 335 that has negative fixed charge and a third region 336 that has positive fixed charge. The narrow-bandgap layer 304 has a third region 337 that has negative fixed charge and a third region 338 that has positive fixed charge. The third regions 335, 336, 337 and 338 are formed by doping negative and positive fixed charge into each of the narrow-bandgap layers 302 and 304. The concentration of the negative fixed charge in the third regions 335 and 337 and the concentration of the positive fixed charge in the third regions 336 and 338 are lower than the concentration of the negative fixed charge in the first regions 331 and 333 and the concentration of the positive fixed charge in the second regions 332 and 334. The third regions 335 and 336 are provided between the first region 331 and the second region 332 that are contained in a double junction structure that has the first junction portion 351 and the second junction portion 352. The third regions 337 and 338 are provided between the first region 333 and the second region 334 that are contained in a double junction structure that has the first junction portion 353 and the second junction portion 354.

At the time of non-bias of the semiconductor apparatus 30, a 2DHG region 341 and a 2DEG region 342 are formed in the narrow-bandgap layer 302 joined at the first junction portion 351 and at the second junction portion 352. Furthermore, a 2DHG region 343 and a 2DEG region 344 are formed in the narrow-bandgap layer 304 joined at the first junction portion 353 and the second junction portion 354. The 2DHG regions 341 and 343 are electrically connected to the p layers 311 and 313, respectively, but are not electrically connected to the n layers 321 and 323. Furthermore, the 2DEG regions 342 and 344 are electrically connected to the n layers 323 and 325, respectively, but are not electrically connected to the p layers 313 and 315. As a result, the 2DHG regions 341 and 343 and the 2DEG regions 342 and 344 accumulate charge. As shown in FIG. 5, at the time of reverse bias, depletion layers extend between the electrode semiconductor layer 310 and the 2DHG regions 341 and 343 and between the electrode semiconductor layer 320 and the 2DEG regions 342 and 344, so that a withstanding voltage is maintained. A desired withstanding voltage can be kept by adjusting the thickness or the bandgap of each of the layers that constitute the layered structure 300. According to the semiconductor apparatus 30, since the 2DHG regions 341 and 343 and the 2DEG regions 342 and 344 accumulate charge, it is possible to realize a small-size semiconductor apparatus.

Furthermore, since the semiconductor apparatus 30 is provided with the third regions 335 to 338, the bands of the narrow-bandgap layers 302 and 304 are raised at the time of reverse bias as in the semiconductor apparatuses 11 and 12. As a result, the tunnel current of electrons and the tunnel current of positive holes decrease between the 2DHG region 341 and the 2DEG region 342 and between the 2DHG region 343 and the 2DEG region 344. As a result, the withstanding voltage therebetween improves.

Sixth Embodiment

Figure 6:
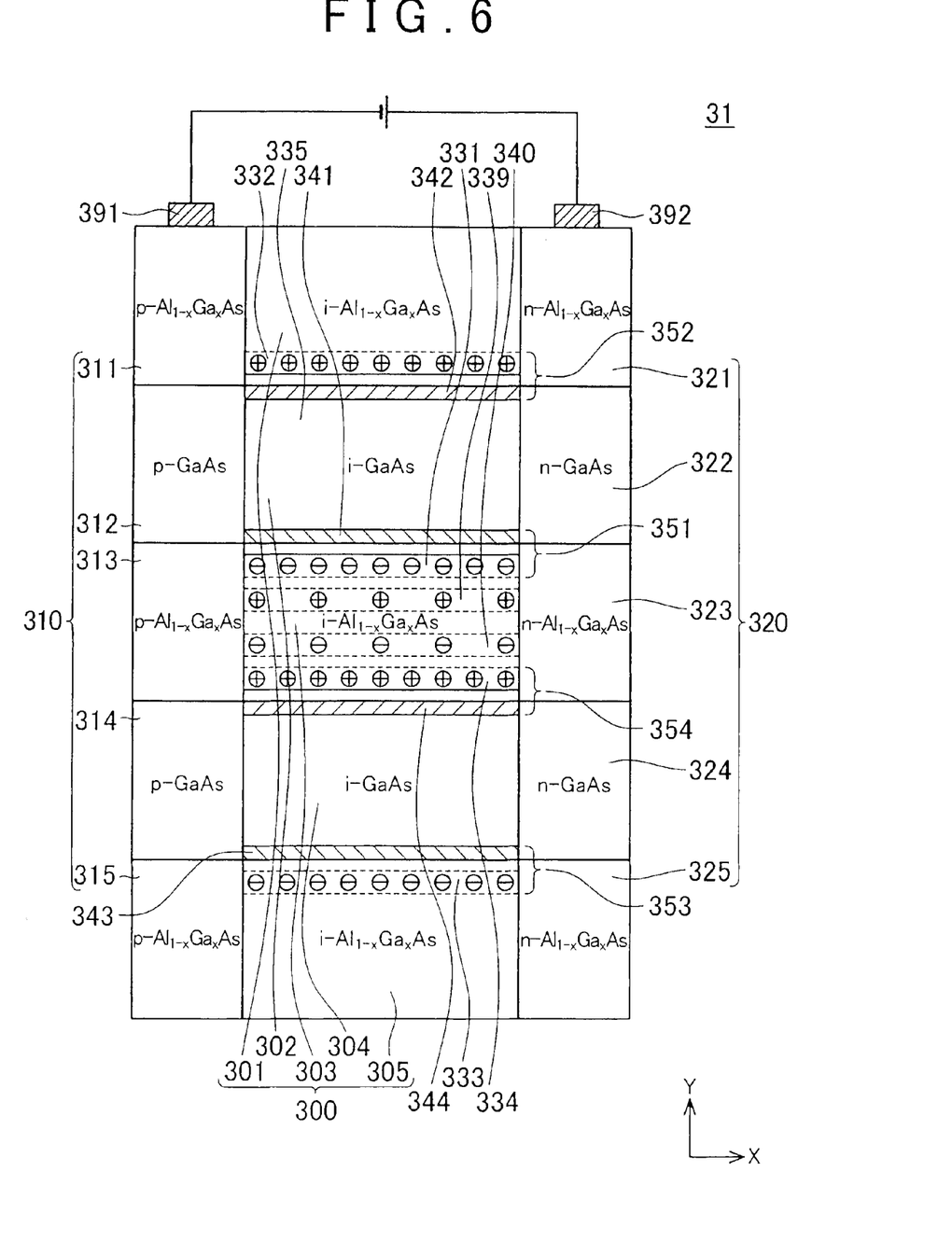
FIG. 6 is a diagram schematically showing a sectional structure of a semiconductor apparatus in accordance with a sixth embodiment of the invention.

In a semiconductor apparatus 31 shown in FIG. 6, the wide-bandgap layer 303 has a third region 339 that has negative fixed charge and a third region 340 that has positive fixed charge. The third regions 339 and 340 are formed by doping negative fixed charge and positive fixed charge into the wide-bandgap layer 303. The concentration of the negative fixed charge in the third region 339 and the concentration of the positive fixed charge in the third region 340 are lower than the concentration of the negative fixed charge in the first regions 331 and 333 and the concentration of the positive fixed charge in the second regions 332 and 334. The third regions 339 and 340 are provided between a first region 351 of a double junction structure that has a first junction portion 351 and a second junction portion 352, and a second region 334 of a double junction structure that has a first junction portion 353 and a second junction portion 354. Other concrete configurations of the semiconductor apparatus 31 are substantially the same as those of the semiconductor apparatus 30.

Since the semiconductor apparatus 31 is provided with the third regions 339 and 340, the band of the wide-bandgap layer 303 is raised at the time of reverse bias, as in the semiconductor apparatuses 11, 12 and 30. As a result, the tunnel current of electrons and the tunnel current of positive holes decrease between the 2DHG region 341 and the 2DEG region 344, and the withstanding voltage therebetween increases. The other operation and effects obtained at the time of non-bias and at the time of reverse bias are substantially the same as those obtained by the semiconductor apparatus 30.

As shown above in conjunction with the fifth embodiment and the sixth embodiment, the third regions may be provided in wide-bandgap layers, or may also be provided in narrow-bandgap layers. Furthermore, the third regions may also be provided in both a wide-bandgap layer and a narrow-bandgap layer. In order to improve the withstanding voltage of the semiconductor apparatus, the third region may be provided in a layer that has the lowest withstanding voltage of the layers included in a double junction structure.

Seventh Embodiment

Figure 7:
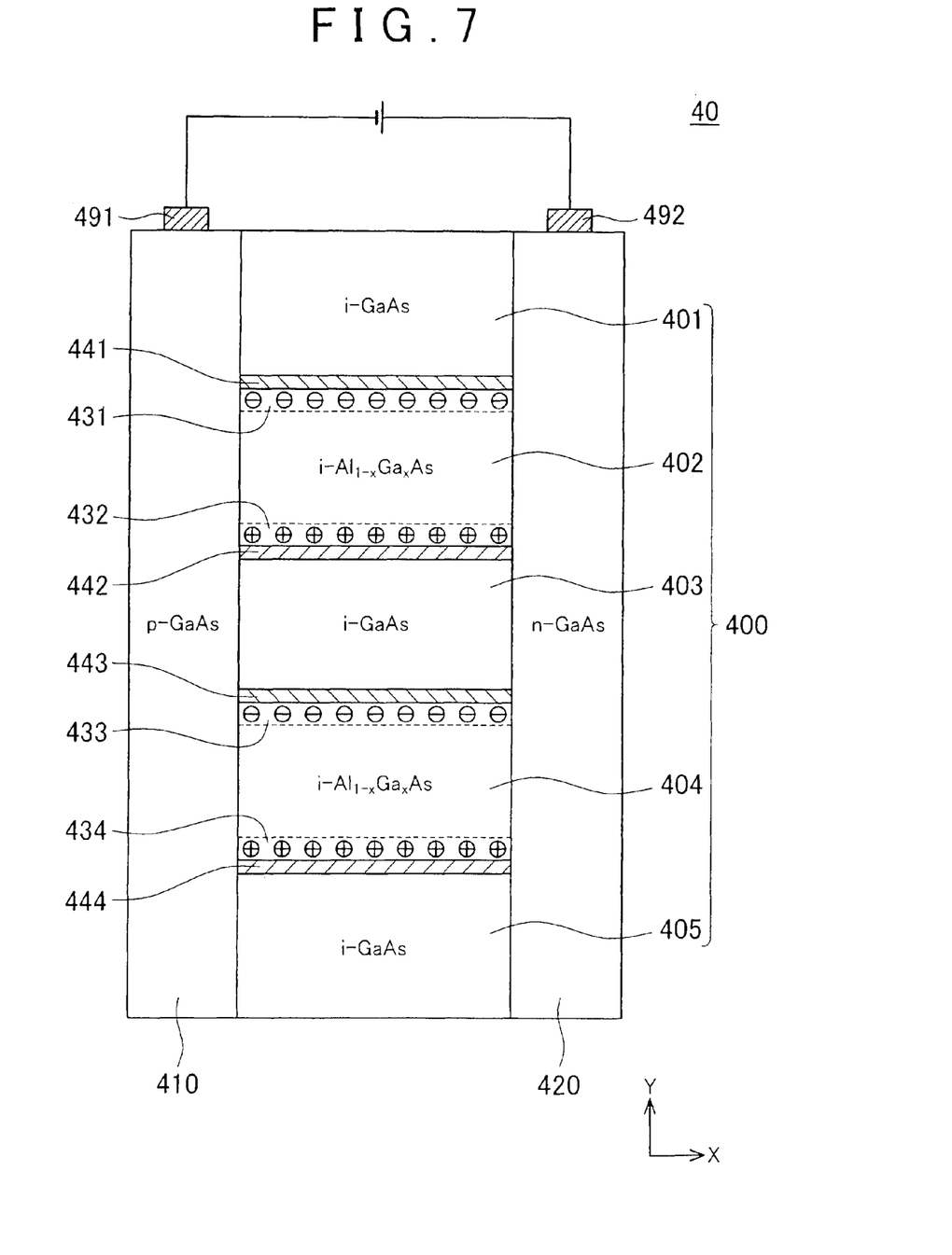
FIG. 7 is a diagram schematically showing a sectional structure of a semiconductor apparatus in accordance with a seventh embodiment of the invention.

A semiconductor apparatus 40 shown in FIG. 7 includes a layered structure 400, a p-type electrode semiconductor layer 410, an n-type electrode semiconductor layer 420, a first electrode 491 joined to a surface of the p-type electrode semiconductor layer 410, and a second electrode 492 joined to a surface of the n-type electrode semiconductor layer 420. The electrode semiconductor layer 410 is formed by a single semiconductor layer of the p-type whose material is GaAs. The electrode semiconductor layer 420 is formed by a single semiconductor layer of the n-type whose material is GaAs. Other concrete configurations of the semiconductor apparatus 40 are substantially the same as those of the semiconductor apparatus 20. The other concrete configurations of the semiconductor apparatus 40 can be understood merely by reading the description of the semiconductor apparatus 20 while assuming that the 2 in the hundred's place of each reference numeral has been replaced by 4.

In the semiconductor apparatus 40, since each of the electrode semiconductor layers 410 and 420 is formed by a single semiconductor layer, it is possible to reduce the resistance to current that flows in the electrode semiconductor layers 410 and 420 in directions parallel to the Y directions.

MODIFICATIONS

The p-type electrode semiconductor layers and the n-type electrode semiconductor layers in the semiconductor apparatuses in accordance with the first to seventh embodiments may be replaced by Schottky electrode layers. Examples of Schottky electrode layers that can be suitably used include metal layers of Al, Pt, Au, Ni and Pd and multi-layer metal layers obtained by layering any of the aforementioned metal layers.

While the embodiments of the invention have been described above, the foregoing embodiments are merely illustrative, and do not limit the scopes of the invention. The invention includes various modifications and changes illustrated above. For example, although the extending direction of each electrode semiconductor layer (the direction in which the electrode semiconductor layer is adjacent to the layered structure) is orthogonal to the laminating direction (the first direction) of the layered structure in the foregoing embodiments, this is not restrictive. That is, the extending direction of each electrode semiconductor layer (the direction in which the electrode semiconductor layer is adjacent to the layered structure) may be any direction as long as the extending direction intersects with the laminating direction of the layered structure.

The invention claimed is:

1. A semiconductor apparatus comprising:
   a layered structure in which at least one narrow-bandgap layer formed from a material that has a narrower bandgap than the material of a layer adjacent to the narrow-bandgap layer in a first direction or a direction opposite to the first direction and at least one wide-bandgap layer formed from a material that has a wider bandgap than the material of a layer adjacent to the wide-bandgap layer in the first direction or the direction opposite to the first direction are alternately layered, the layered structure including at least one double junction structure that has a first junction at which the wide-bandgap layer and the narrow-bandgap layer are layered and joined to each other in that order in the first direction and a second junction at which the narrow-bandgap layer and the wide-bandgap layer are layered and joined to each other in that order in the first direction, and each of the at least one double junction structure contains at least one pair of a first region that has negative fixed charge and a second region that has positive fixed charge;
   a first electrode semiconductor layer which extends in a second direction that intersects with the first direction and which is joined to each narrow-bandgap layer of the layered structure and each wide-bandgap layer of the layered structure, wherein the first electrode semiconductor layer is formed by doping a first electroconductive type impurity into each narrow-bandgap layer of the layered structure and each wide-bandgap layer of the layered structure; and
   a second electrode semiconductor layer which extends in a third direction that intersects with the first direction and which is joined to each narrow-bandgap layer of the layered structure and each wide-bandgap layer of the layered structure, wherein the second electrode semiconductor layer is formed by doping a second electroconductive type impurity into each narrow-bandgap layer of the layered structure and each wide-bandgap layer of the layered structure.

2. The semiconductor apparatus according to claim 1, wherein difference between concentration of hole induced by the negative fixed charge and concentration of electron induced by the positive fixed charge is such a concentration difference that the hole alone or the electron alone becomes absent when voltage is applied between the first electrode semiconductor layer and the second electrode semiconductor layer.

3. The semiconductor apparatus according to claim 1, wherein
   the semiconductor apparatus is an electric energy storage semiconductor apparatus.

4. The semiconductor apparatus according to claim 1, wherein:
   the first region is formed by doping the negative fixed charge into the wide-bandgap layer joined at the first junction; and
   the second region is formed by doping the positive fixed charge into the wide-bandgap layer joined at the second junction.

5. The semiconductor apparatus according to claim 1, wherein the negative fixed charge of the first region and the positive fixed charge of the second region include polarization charge that is produced by at least one of spontaneous polarization and piezopolarization.

6. The semiconductor apparatus according to claim 1, wherein the negative fixed charge of the first region and the positive fixed charge of the second region include both fixed charge that is doped and polarization charge produced by at least one of spontaneous polarization and piezopolarization.

7. The semiconductor apparatus according to claim 1, further comprising a third region provided between the first region and the second region that are provided in one of the at least one double junction structure or between the first region provided in one of two mutually adjacent double junction structures of the at least one double junction structure and the second region provided in another one of the two mutually adjacent double junction structures of the at least one double junction structure, the third region having a lower concentration of the positive fixed charge or the negative fixed charge than the first region and the second region.

8. The semiconductor apparatus according to claim 7, wherein
the third region has a region that has negative fixed charge and a region that has positive fixed charge, and,
the region that has negative fixed charge is closer to the second region than to the region that has positive fixed charge.

9. The semiconductor apparatus according to claim 7, wherein the third region is provided in a layer that has the lowest withstanding voltage of the layers provided in one of the at least one double junction structure.

10. The semiconductor apparatus according to claim 1, wherein the first electrode semiconductor layer or the second electrode semiconductor layer is formed from the same material as a layer that has the narrowest bandgap of the layers that are included in the layered structure, and is formed as a single semiconductor layer.

11. A semiconductor apparatus comprising:
a layered structure in which at least one narrow-bandgap layer formed from a material that has a narrower bandgap than the material of a layer adjacent to the narrow-bandgap layer in a first direction or a direction opposite to the first direction and at least one wide-bandgap layer formed from a material that has a wider bandgap than the material of a layer adjacent to the wide-bandgap layer in the first direction or the direction opposite to the first direction are alternately layered, the layered structure including at least one double junction structure that has a first junction at which the wide-bandgap layer and the narrow-bandgap layer are layered and joined to each other in that order in the first direction and a second junction at which the narrow-bandgap layer and the wide-bandgap layer are layered and joined to each other in that order in the first direction, and at least one pair of a first region that has negative fixed charge and a second region that has positive fixed charge are contained;
a Schottky electrode layer which extends in a second direction that intersects with the first direction and which is Schottky joined to each narrow-bandgap layer of the layered structure and each wide-bandgap layer of the layered structure; and
an electrode semiconductor layer which extends in a third direction that intersects with the first direction and which is joined to each narrow-bandgap layer of the layered structure and each wide-bandgap layer of the layered structure, wherein the electrode semiconductor layer is formed by doping an electroconductive type impurity into each layer of the layered structure.

12. The semiconductor apparatus according to claim 11, wherein difference between concentration of hole induced by the negative fixed charge and concentration of electron induced by the positive fixed charge is such a concentration difference that the hole alone or the electron alone becomes absent when voltage is applied between the Schottky electrode layer and the electrode semiconductor layer.

13. The semiconductor apparatus according to claim 11, wherein
the first region is formed by doping the negative fixed charge into the wide-bandgap layer joined at the first junction; and
the second region is formed by doping the positive fixed charge into the wide-bandgap layer joined at the second junction.

14. The semiconductor apparatus according to claim 11, wherein the negative fixed charge of the first region and the positive fixed charge of the second region include polarization charge that is produced by at least one of spontaneous polarization and piezopolarization.

15. The semiconductor apparatus according to claim 11, wherein the negative fixed charge of the first region and the positive fixed charge of the second region include both fixed charge that is doped and polarization charge produced by at least one of spontaneous polarization and piezopolarization.

16. The semiconductor apparatus according to claim 11, further comprising a third region provided between the first region and the second region that are provided in one of the at least one double junction structure or between the first region provided in one of two mutually adjacent double junction structures of the at least one double junction structure and the second region provided in another one of the two mutually adjacent double junction structures of the at least one double junction structure, the third region having a lower concentration of the positive fixed charge or the negative fixed charge than the first region and the second region.

17. The semiconductor apparatus according to claim 16, wherein
the third region has a region that has negative fixed charge and a region that has positive fixed charge, and
the region that has negative fixed charge is closer to the second region than to the region that has positive fixed charge.

18. The semiconductor apparatus according to claim 16, wherein the third region is provided in a layer that has the lowest withstanding voltage of the layers provided in one of the at least one double junction structure.

19. The semiconductor apparatus according to claim 11, wherein the electrode semiconductor layer is formed from the same material as a layer of the layered structure that has the narrowest bandgap of the layers of the layered structure, and is formed as a single semiconductor layer.

20. The semiconductor apparatus according to claim 1, wherein
the first region is closer to the first junction than to a center position of the wide-bandgap layer in the first direction, and
the second region is closer to the second junction than to the center position of the wide-bandgap layer in the first direction.

21. The semiconductor apparatus according to claim 11, wherein
the first region is closer to the first junction than to a center position of the wide-bandgap layer in the first direction, and
the second region is closer to the second junction than to the center position of the wide-bandgap layer in the first direction.

* * * * *